United States Patent
Kim (10) Patent No.: US 6,743,711 B2
(45) Date of Patent: Jun. 1, 2004

(54) METHOD FOR FORMING DUAL DAMASCENE LINE STRUCTURE

(75) Inventor: Kil Ho Kim, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 67 days.

(21) Appl. No.: 10/062,716

(22) Filed: Feb. 5, 2002

(65) Prior Publication Data
US 2003/0003716 A1 Jan. 2, 2003

(30) Foreign Application Priority Data
Jun. 27, 2001 (KR) ..................................... P2001-36970

(51) Int. Cl.⁷ ......................................... H01L 21/4763
(52) U.S. Cl. ....................... 438/637; 438/638; 438/618; 438/622; 438/624; 438/672
(58) Field of Search ................................ 438/618, 620, 438/622, 624, 629, 636, 637, 638, 652, 672, 700, 639, 717, 942; 257/758, 760, 774

(56) References Cited

U.S. PATENT DOCUMENTS

| | | | |
|---|---|---|---|
| 5,466,639 A | 11/1995 | Ireland | |
| 5,990,015 A | 11/1999 | Lin et al. | |
| 6,001,734 A * | 12/1999 | Drynan | 438/637 |
| 6,004,883 A | 12/1999 | Yu et al. | |
| 6,077,769 A | 6/2000 | Huang et al. | |
| 6,140,226 A * | 10/2000 | Grill et al. | 438/637 |
| 6,143,649 A * | 11/2000 | Tang | 438/640 |
| 6,156,643 A | 12/2000 | Chan et al. | |
| 6,162,587 A * | 12/2000 | Yang et al. | 430/314 |
| 6,300,238 B1 * | 10/2001 | Lee et al. | 438/624 |
| 6,365,506 B1 * | 4/2002 | Chang et al. | 438/624 |
| 6,468,898 B1 * | 10/2002 | Usami | 438/638 |
| 6,479,391 B2 * | 11/2002 | Morrow et al. | 438/706 |
| 6,573,176 B2 * | 6/2003 | Hong | 438/637 |

* cited by examiner

*Primary Examiner*—Michael Trinh
*Assistant Examiner*—Maria Guerrero
(74) *Attorney, Agent, or Firm*—Morgan, Lewis & Bockius LLP

(57) ABSTRACT

A method for forming a dual damascene line structure includes forming an inter-metal dielectric including a first region and a second region on a semiconductor substrate, forming a first hard mask material layer on an entire surface of the inter-metal dielectric, removing the first hard mask material layer on the first region, forming a second hard mask material layer on an entire surface of the inter-metal dielectric, forming a hard mask to remove a portion of the first hard mask material layer on the second region, etching the inter-metal dielectric of the first region to a first thickness using the hard mask, exposing the inter-metal dielectric of the second region, and etching the exposed inter-metal dielectric to simultaneously form a via hole and a trench having the via hole.

10 Claims, 8 Drawing Sheets

METHOD FOR FORMING DUAL DAMASCENE LINE STRUCTURE

The present invention claims the benefit of Korean Patent Application No. P2001-36970 filed in Korea on Jun. 27, 2001, which is hereby incorporated by reference.

BACKGROUND OF THE INVENTION

1. Field of the Invention

The present invention relates to a method for forming a semiconductor device, and more particularly, to a method for forming a dual damascene line structure to obtain a fine pattern and to minimize polymer production.

2. Background of the Related Art

A related art method for forming a dual damascene line structure will now be explained with reference to the accompanying drawings.

FIGS. 1A to D are cross-sectional views illustrating process steps of a related art method for forming a dual damascene line structure, and FIGS. 2A to D are cross-sectional views illustrating another related art method for forming a dual damascene line structure.

A method for forming a via hole after forming a trench and a method for forming a trench after forming a via hole have been suggested as typical methods.

Figure 1A:
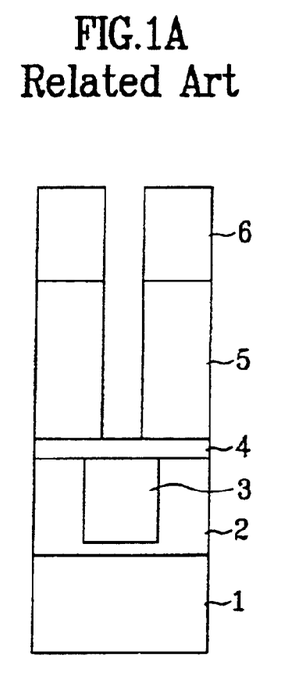
FIGS. 1A to D are cross-sectional views illustrating process steps of a related art method for forming a dual damascene line structure.

As shown in FIG. 1A, the related art method for forming a dual damascene line structure includes forming a trench for forming a lower metallic line within an insulating layer 2 on a semiconductor substrate 1, and then burying a metallic layer inside the trench to form a lower metallic line 3.

Subsequently, a diffusion barrier layer 4 is formed on the lower metallic line 3. Then, a low inter-metal dielectric IMD material is deposited on the diffusion barrier layer 4 to form an inter-metal dielectric IMD 5.

Additionally, after depositing a photoresist on the IMD 5, a photoresist pattern 6 having a via hole pattern is formed by exposure and developing processes so that a portion of the IMD 5 is exposed.

In this case, the photoresist pattern 6 is formed thick enough for forming a deep via hole in a later process. Alternatively, the photoresist pattern 6 is formed to have a higher etch selectivity than that of the IMD 5.

Using the photoresist pattern 6 as a mask, the IMD 5 is etched by a plasma dry etching process to form a via hole therein.

Figure 1B:
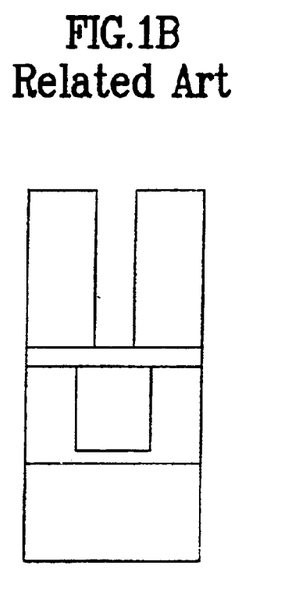

As shown in FIG. 1B, after removing the photoresist pattern 6, a polymer remaining within the via hole is removed by a cleaning process.

Figure 1C:
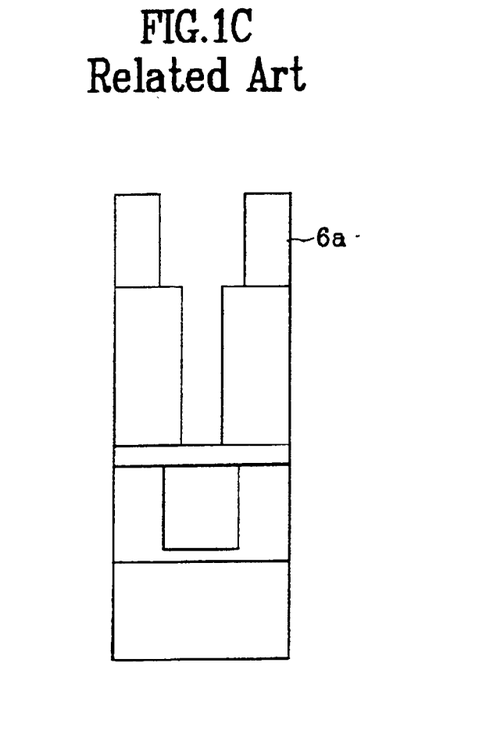

In addition, as shown in FIG. 1C, after depositing a photoresist on the IMD 5, the IMD 5 is negatively patterned to expose a portion of the IMD 5, thereby forming a photoresist pattern 6a having a trench pattern.

Figure 1D:
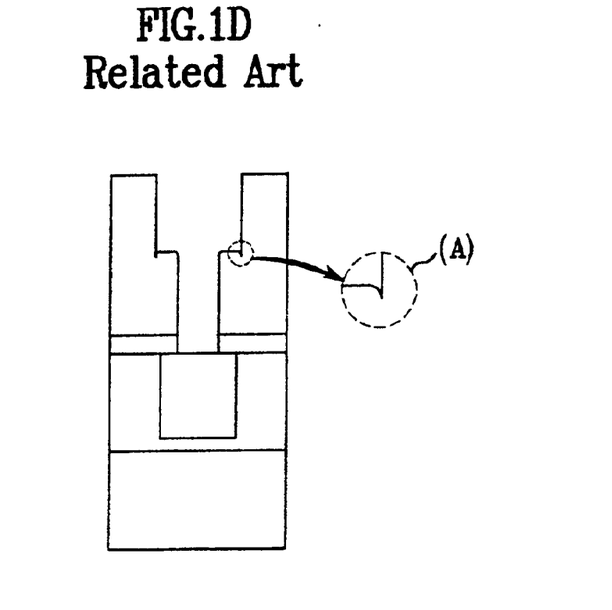

Subsequently, as shown in FIG. 1D, using the photoresist pattern 6a as a mask, the IMD 5 is selectively etched to form a trench.

In this case, a micro-trench shown as portion 'A' is formed inside the trench during the etching process.

Additionally, after depositing a metallic material such as tungsten, which is thick enough to completely bury the via hole and the trench, the metallic material is planarized by a chemical mechanical polishing (CMP) process. Thus, an upper surface of the IMD 5 is exposed, thereby forming a plug (not shown) and an upper metallic line (not shown).

The process of the aforementioned related art method for forming a dual damascene line structure is simple and has an advantage of preventing an increase in a dielectric constant of the IMD 5 through the diffusion barrier layer 4. However, the aforementioned method has a disadvantage in that, in order to form a deep via hole, the photoresist pattern 6 should be thick enough or the IMD 5 should have a higher etch selectivity than that of the photoresist pattern.

In addition, removing the polymer that remains within the via hole is difficult, and a micro-trench may be formed in etching the trench.

Figure 2A:
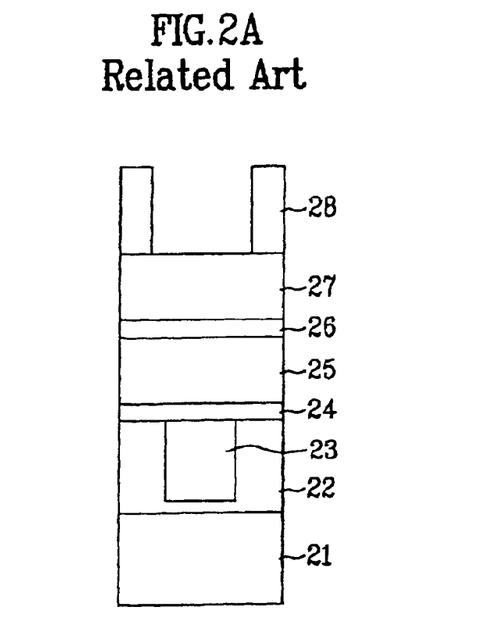
FIGS. 2A to D are cross-sectional views illustrating process steps of another related art method for forming a dual damascene line structure.

In FIG. 2A, another related art method of forming a dual damascene line structure includes sequentially depositing a diffusion barrier layer 24, a first IMD 25, an etching stop layer 26, and a second IMD 27 on a semiconductor substrate 21 including a lower metallic line 23 formed within an insulating layer 22.

Then, after depositing a photoresist on the second IMD 27, a photoresist pattern 28 having a trench pattern is formed by exposure and development processes, thereby exposing a portion of the second IMD 27.

Figure 2B:
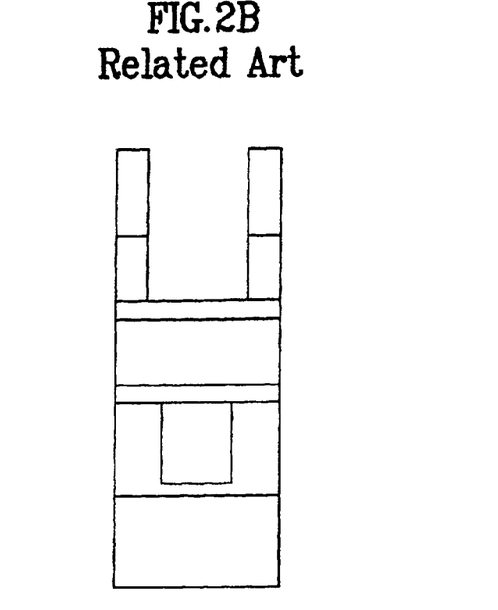

As shown in FIG. 2B, using the photoresist pattern 28 as a mask, the second IMD 27 is etched by a plasma dry etching process exposing a portion of the etching stop layer 26 so as to form a trench.

Figure 2C:
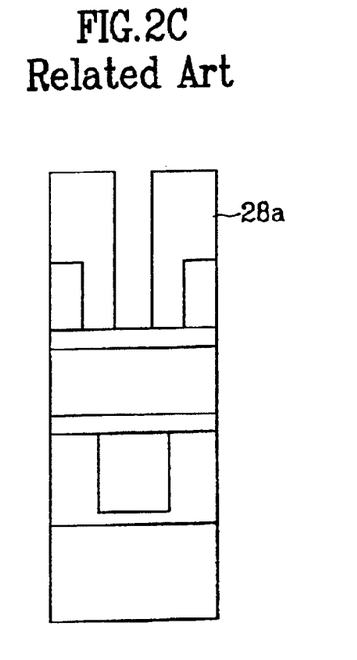

In addition, as shown in FIG. 2C, the photoresist pattern 28 having a trench pattern is removed. A photoresist is once again deposited on the entire surface. The photoresist is then patterned by a negative patterning process to expose a portion of the etching stop layer 26 so as to form a photoresist pattern 28a having a via hole pattern.

Figure 2D:
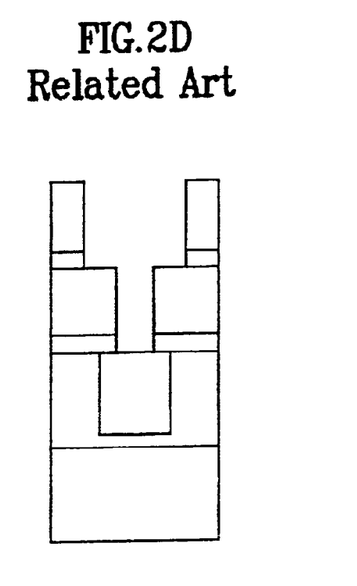

Subsequently, as shown in FIG. 2D, using the photoresist pattern 28a as a mask, the etching stop layer 26, the first IMD 25, and the diffusion barrier layer 24 are selectively etched exposing a portion of a lower metallic line so as to form a via hole.

Then, after depositing a metallic material such as tungsten, which is thick enough to completely bury the via hole and the trench, the metallic material is planarized by a CMP process exposing an upper surface of the second IMD 27 to form a plug (not shown) and an upper metallic line (not shown).

The related art process of the aforementioned method for forming a dual damascene line structure has an advantage of controlling the depth and profile of etching during the trench etching and the via hole etching processes. However, the aforementioned method has a difficulty in controlling the width of the via hole when forming the photoresist pattern for a via hole etching process and an increase in dielectric constant of the IMD due to the etching stop layer.

As discussed above, the two related art methods for forming a dual damascene line structure have the following problems. When etching a via hole and a trench, by using a photoresist pattern as a mask, it is difficult to form a fine pattern due to the thickness of the photoresist pattern.

This not only results in a difficulty in accurately controlling the size of the trench or the via hole, but also results in a plurality of polymers produced during the etching process of IMDs.

SUMMARY OF THE INVENTION

Accordingly, the present invention is directed to a method for forming a dual damascene line structure that substantially obviates one or more problems due to limitations and disadvantages of the related art.

An object of the present invention is to provide a method for forming a dual damascene line structure capable of forming a fine pattern and minimizing polymer produced during the process, by using a hard mask having a double pattern of a via hole and a trench.

Additional features and of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a method for forming a dual damascene line structure includes forming an inter-metal dielectric including a first region and a second region on a semiconductor substrate, forming a first hard mask material layer on an entire surface of the inter-metal dielectric, removing the first hard mask material layer on the first region, forming a second hard mask material layer on an entire surface of the inter-metal dielectric, forming a hard mask to remove a portion of the first hard mask material layer on the second region, etching the inter-metal dielectric of the first region to a first thickness using the hard mask, exposing the inter-metal dielectric of the second region, and etching the exposed inter-metal dielectric to simultaneously form a via hole and a trench having the via hole.

In another aspect, a method for forming a dual damascene line structure includes sequentially forming a diffusion barrier film, an inter-metal dielectric including a first region and a second region, and a first hard mask material layer on a semiconductor substrate having a lower metallic line formed within an insulating layer, selectively removing the first hard mask material layer on the first region using a photoresist pattern, depositing a second hard mask material layer on an entire surface of the inter-metal dielectric, removing the first hard mask material layer on the second region to form a hard mask having a double pattern, etching the inter-metal dielectric of the first region to a first thickness using the hard mask, removing the hard mask on the second region, and etching the inter-metal dielectric to simultaneously form a via hole and a trench having the via hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 3A to I are cross-sectional views illustrating the process steps of a method for forming a dual damascene line structure according to the present invention.

Figure 3A:
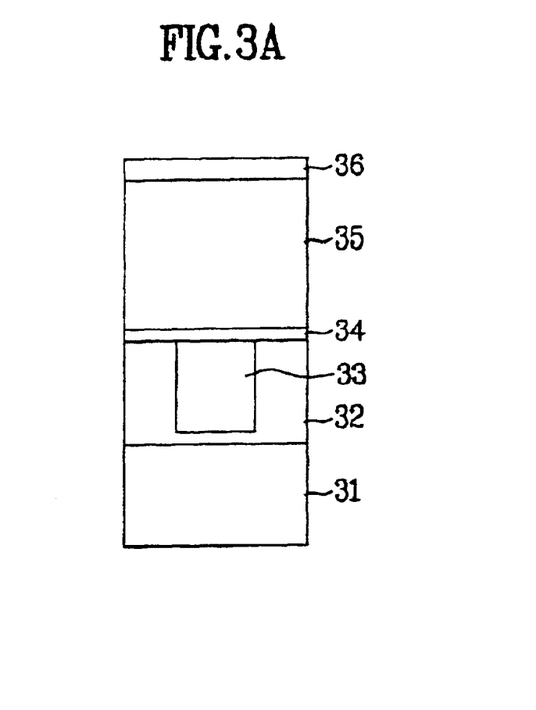
FIGS. 3A to I are cross-sectional views illustrating process steps of a method for forming a dual damascene line structure according to the present invention.

As shown in FIG. 3A, a trench is formed within an insulating layer 32 on a semiconductor substrate 31 by a damascene method. In this embodiment, a metallic material is buried within the trench for forming a lower metallic line to form a lower metallic line 33.

Subsequently, a diffusion barrier layer 34 is formed on the lower metallic line 33, and a low IMD material is deposited on the diffusion barrier layer 34 to form an IMD 35 consisting of a first region and a second region including the first region.

In this case, the first region is where a via hole is formed within the IMD 35, and the second region is where a trench is formed.

The IMD 35 becomes an insulating layer for the lower metallic line 33 and an upper metallic line, which will be formed in a later process.

In addition, a metallic material, such as Ti, TiN, Ta, TaN, or tungsten (W), is deposited on the IMD 35 to form a hard mask material layer 36.

The hard mask material layer 36 is deposited at a minimum thickness enabling the IMD 35 to be etched with plasma in a later process.

Figure 3B:
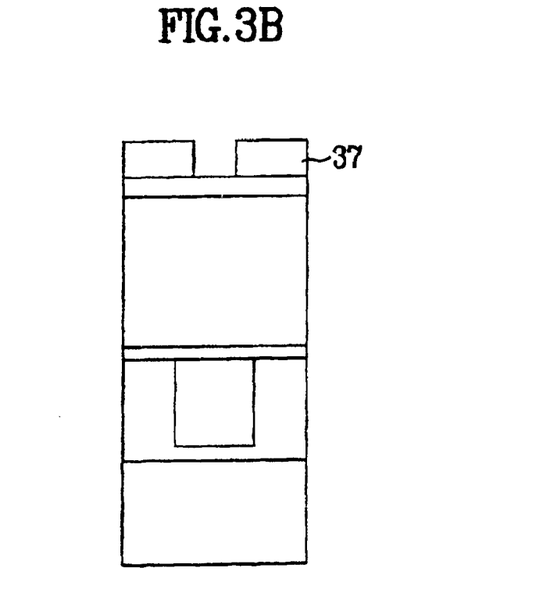

As shown in FIG. 3B, after depositing a photoresist on the hard mask 36, a photoresist pattern 37, whereby the photoresist on the first region is removed, is formed by exposure and development processes so that a portion of the hard mask 36 is exposed.

In this case, the photoresist is deposited at a minimum thickness enabling the hard mask material layer 36 to be etched in a later process.

The first photoresist pattern 37 formed with a minimum thickness is advantageous not only in forming a fine pattern but also in forming an accurate critical dimension of the pattern.

Additionally, the photoresist is patterned in a state whereby the IMD 35 is completely protected by the hard mask material layer 36. Therefore, the IMD 35 on the lower portion of the hard mask material layer 36 can be prevented from being damaged or deformed by a developer.

Figure 3C:
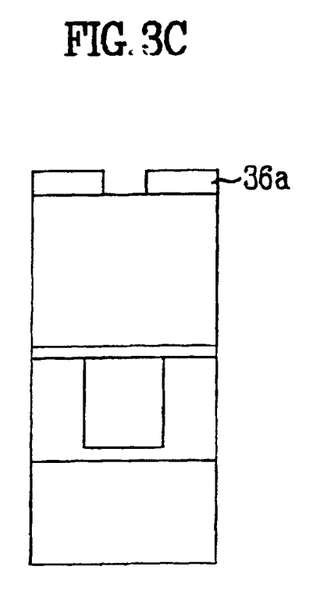

As shown in FIG. 3C, using the photoresist pattern 37 as a mask, the hard mask material layer 36 on the first region is selectively removed to form a negative via hole within the hard mask material layer 36.

In this case, the aforementioned etching process is carried out in a dry etching method using a plasma with which hard mask material layer 36 etching is faster than IMD 35 etching. When one of Ti, TiN, Ta, and TaN is chosen for the hard mask material layer 36, a plasma including an activated gas consisting mainly of $Cl_2+BCl_3$ is used, and when tungsten (W) is used as the hard mask material layer 36, a plasma including an activated gas consisting mainly of $SF_6$ is used, thereby obtaining a desired etch selectivity of the IMD 35.

Figure 3D:
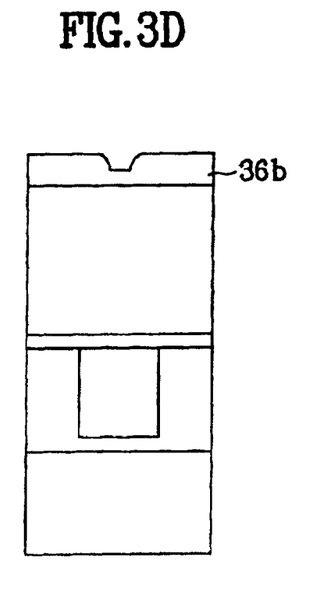

As shown in FIG. 3D, a metallic material identical to that of the hard mask material layer 36a is used for being additionally deposited on the patterned hard mask material layer 36a.

In this case, the thickness of the additionally deposited metallic material is identical to that of the original hard mask material layer 36. Then, a metallic material is deposited on an inner sidewall in the shape of a spacer within the first region of the hard mask material layer 36a so as to form a curved surface.

Figure 3E:
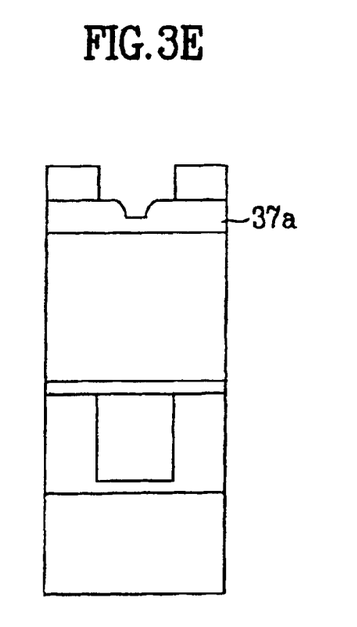

As shown in FIG. 3E, after depositing photoresist on the additionally deposited hard mask material layer 36b, photoresist on the second region is selectively removed by exposure and development processes, thereby exposing a portion of the hard mask material layer 36b to form a photoresist pattern 37a having a negative trench pattern.

In this case, the photoresist pattern 37a is formed in a small thickness enabling the additionally deposited hard mask material layer 36b to be etched.

Additionally, photoresist is patterned in a state whereby the IMD 35 is completely protected by the hard mask material layer 36b. Therefore, damage or deformation of the inter-metal dielectric 35 caused by a developer can be prevented.

Figure 3F:
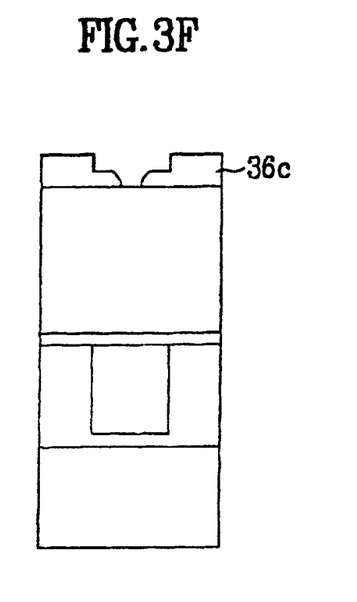

As shown in FIG. 3F, using the photoresist pattern 37a as a mask, the hard mask material layer 36b on the second region is selectively etched. Then, a hard mask 36c of a double pattern is formed, which consists of a via hole pattern having a curved spacer shaped surface and a trench pattern, which is etched to the same thickness as the additionally deposited hard mask material layer 36b.

In this case, the aforementioned etching process is carried out to etch the hard mask material layer 36b using a plasma with which a hard mask material layer 36b etching is faster than an inter-metal dielectric 35 etching. When one of Ti, TiN, Ta, or TaN may be chosen for the hard mask material layer 36b, a plasma including an activated gas consisting mainly of $Cl_2+BCl_3$ is used, and when tungsten (W) is used as the hard mask material layer 36b, a plasma including an activated gas consisting mainly of $SF_6$ is used in a dry etching process.

The etching process is carried out until the IMD 35 is exposed at a bottom surface of the first region of the hard mask 36c.

Afterwards, the photoresist pattern 37a on the hard mask 36c is removed. In this case, the curved inner sidewall surface of the hard mask 36c in the first region facilitates the removal of the remaining photoresist pattern.

Figure 3G:
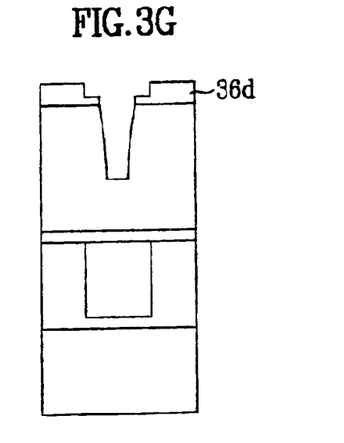

As shown in FIG. 3G, using the hard mask 36b as a mask, the exposed portion of the IMD 35 is etched at a fixed thickness to form a via hole pattern within the IMD 35.

In this case, the via hole pattern within the IMD 35 is formed by an etching process using a plasma having an etch selectivity higher than that of the hard mask 36c. The plasma having such etch selectivity is used with a $C_aF_b+C_xH_yF_z$ (wherein a, b, x, y, and z are integers) based gas combined with another gas such as $O_2$, $N_2$, or Ar.

A via hole pattern is only formed within an inter-metal dielectric that is not protected by the hard mask 36c through such plasma etching process. Due to the curved sidewall surface of the hard mask 36c in the first region, the via hole pattern formed within the IMD 35 has a sloped shape.

Figure 3H:
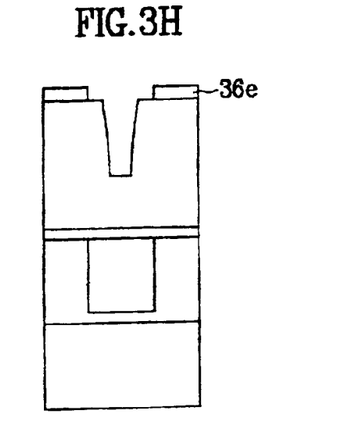

As shown in FIG. 3H, using a plasma whereby a hard mask 36d etching is faster than an IMD 35 etching, the hard mask 36d of the second region is removed.

Figure 3I:
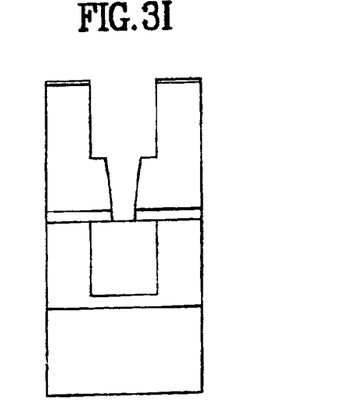

As shown in FIG. 3I, using the hard mask 36e having only a trench pattern as a mask, the IMD 35 with a via hole pattern is selectively etched to form a via hole and a trench at the same time, whereby the via hole penetrates the IMD 35 to reach a lower metallic line 33.

In this case, using a plasma whereby etching an IMD 35 is faster than etching the hard mask 36e, the plasma having such etch selectivity is used with $C_aF_b+C_xH_yF_z$ (wherein a, b, x, y, and z are integers) based gas combined with another gas such as $O_2$, $N_2$, or Ar.

The sloped via hole pattern within the IMD 35 enables the via hole to form a positive slope which facilitates a later process of filling the via hole with a metallic material.

Subsequently, after removing the remaining hard mask material through a plasma etching process, a metallic material thick enough to completely bury the via hole and the trench is deposited and planarized by a CMP process, so that an upper surface of the IMD 35 is exposed, thereby forming (not shown) and an upper metallic line (not shown).

The aforementioned method for forming a dual damascene line structure according to the present invention has the following advantages.

First, by minimizing the thickness of a photoresist for patterning a hard mask, a fine pattern can be formed.

This facilitates the size control of a via hole or a trench and enables accurate critical dimensions.

Then, by using a hard mask with a double pattern consisting of a via hole pattern and a trench pattern at the same time, the process can be simplified. In addition, an etching process of an IMD is carried out in a state with absolutely no photoresist, thereby reducing the amount of metallic polymer produced during the process.

Finally, by forming the via hole to have a positive slope, the process of filling the via hole with a metallic material is facilitated.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for forming a dual damascene line structure, comprising the steps of:

forming an inter-metal dielectric including a first region and a second region on a semiconductor substrate;

forming a first hard mask material layer on an entire surface of the inter-metal dielectric;

removing the first hard mask material layer on the first region to expose the inter-metal dielectric;

forming a second hard mask material layer on the first mask material layer and the exposed inter-metal dielectric with a metallic material identical to that of the first hard mask material layer, wherein the second hard mask material layer is deposited on an inner sidewall in the shape of a spacer within the first region of the first hard mask material layer to form a curved surface;

forming a mask by removing a portion of the first and second hard mask material layer on the second region;

etching the inter-metal dielectric of the first region to a first thickness using the inner profile of the mask to form a via hole having a positive slope of the mask;

exposing the inter-metal dielectric of the second region; and etching the exposed inter-metal dielectric to form a trench having the via hole.

2. The method according to claim 1, further comprising the step of removing the mask material remaining after forming the via hole and the trench.

3. The method according to claim 1, further comprising the step of depositing a metallic material within the via hole and the trench to form a plug and an upper metal line.

4. A method for forming a dual damascene line structure, comprising the steps of:

sequentially forming a diffusion barrier film, an inter-metal dielectric including a first region and a second region, and a first hard mask material layer on a semiconductor substrate having a lower metallic line formed within an insulating layer;

selectively removing the first hard mask material layer on the first region using a photoresist pattern to expose the inter-metal dielectric;

depositing a second hard mask material layer on the first hard mask material layer and the exposed inter-metal dielectric with a metallic material identical to that of the first hard mask material layer, wherein the second hard mask material layer is deposited on an inner sidewall in the shape of a spacer within the first region of the first hard mask material layer to form a curved surface;

removing a portion of the first and second hard mask material layer on the second region to form a mask having a double pattern;

etching the inter-metal dielectric of the first region to a first thickness using the inner profile of the mask to form a via hole having a positive slope of the mask;

removing the mask on the second region; and etching the inter-metal dielectric to form a trench having the via hole.

5. The method according to claim 4, wherein the inter-metal dielectric is formed of a low inter-metal dielectric material.

6. The method according to claim 4, wherein the mask is formed of one of Ti, TiN, Ta, TaN, and W.

7. The method according to claim 4, wherein the step of etching the first and second hard mask material layer is performed using one of a plasma including an activated gas consisting mainly of $Cl_2+BCl_3$ and a plasma including an activated gas consisting mainly of $SF_6$.

8. The method according to claim 4, wherein a thickness of the deposited second hard mask material layer is the same as a thickness of the first hard mask material layer.

9. The method according to claim 4, wherein the first hard mask material layer on the second region is simultaneously removed when the second hard mask material layer on the first region is etched to expose the inter-metal dielectric.

10. The method according to claim 4, wherein the inter-metal dielectric is etched to form the via hole by using a plasma including a first activated $C_aF_b+C_xH_yF_z$ (wherein a, b, x, y, and z are integers) gas combined with a second gas including $O_2$, $N_2$, and Ar.

* * * * *